(12) United States Patent
Li et al.

(10) Patent No.: US 8,775,896 B2
(45) Date of Patent: Jul. 8, 2014

(54) NON-BINARY LDPC DECODER WITH LOW LATENCY SCHEDULING

(75) Inventors: Zongwang Li, Santa Clara, CA (US); Chung-Li Wang, San Jose, CA (US); Changyou Xu, Fremont, CA (US)

(73) Assignee: LSI Corporation, Milpitas, CA (US)

( * ) Notice: Subject to any disclaimer, the term of this patent is extended or adjusted under 35 U.S.C. 154(b) by 199 days.

(21) Appl. No.: 13/369,468

(22) Filed: Feb. 9, 2012

(65) Prior Publication Data
US 2013/0212447 A1 Aug. 15, 2013

(51) Int. Cl.
*H03M 13/00* (2006.01)

(52) U.S. Cl.
USPC .......................................... 714/758; 714/755

(58) Field of Classification Search
USPC .......................................... 714/752, 755, 758
See application file for complete search history.

(56) References Cited

U.S. PATENT DOCUMENTS

| | | | |
|---|---|---|---|
| 5,278,703 A | 1/1994 | Rub et al. |
| 5,278,846 A | 1/1994 | Okayama et al. |
| 5,317,472 A | 5/1994 | Schweitzer, III |
| 5,325,402 A | 6/1994 | Ushirokawa |
| 5,392,299 A | 2/1995 | Rhines |
| 5,417,500 A | 5/1995 | Martinie |
| 5,513,192 A | 4/1996 | Janku |
| 5,523,903 A | 6/1996 | Hetzler |
| 5,550,810 A | 8/1996 | Monogioudis et al. |
| 5,550,870 A | 8/1996 | Blaker |
| 5,612,964 A | 3/1997 | Haraszti |
| 5,710,784 A | 1/1998 | Kindred |
| 5,717,706 A | 2/1998 | Ikeda |
| 5,802,118 A | 9/1998 | Bliss |
| 5,844,945 A | 12/1998 | Nam |
| 5,898,710 A | 4/1999 | Amrany |
| 5,923,713 A | 7/1999 | Hatakeyama |
| 5,978,414 A | 11/1999 | Nara |
| 5,983,383 A | 11/1999 | Wolf |
| 6,005,897 A | 12/1999 | McCallister |
| 6,023,783 A | 2/2000 | Divsalar |
| 6,029,264 A | 2/2000 | Kobayashi |
| 6,065,149 A | 5/2000 | Yamanaka |
| 6,097,764 A | 8/2000 | McCallister |
| 6,145,110 A | 11/2000 | Khayrallah |
| 6,216,249 B1 | 4/2001 | Bliss |
| 6,216,251 B1 | 4/2001 | McGinn |
| 6,266,795 B1 | 7/2001 | Wei |

(Continued)

OTHER PUBLICATIONS

Axvig et al., "Average Min-Sum Decoding of LDPC Codes", 5th International Symposium on Turbo Codes and Related Topics (2008).

(Continued)

*Primary Examiner* — Sam Rizk
(74) *Attorney, Agent, or Firm* — Hamilton DeSanctis & Cha

(57) ABSTRACT

Various embodiments of the present invention provide systems and methods for decoding of non-binary LDPC codes. For example, a low density parity check data decoder is disclosed that includes a variable node processor operable to perform variable node updates based at least in part on check node to variable node message vectors, a check node processor operable to perform check node updates and to generate the check node to variable node message vectors, and a scheduler operable to cause the variable node processor to use check node to variable node message vectors from multiple decoding iterations when performing the variable node updates for a given decoding iteration.

20 Claims, 5 Drawing Sheets

(56) References Cited

U.S. PATENT DOCUMENTS

| | | | |
|---|---|---|---|
| 6,317,472 | B1 | 11/2001 | Choi |
| 6,351,832 | B1 | 2/2002 | Wei |
| 6,377,610 | B1 | 4/2002 | Hagenauer |
| 6,381,726 | B1 | 4/2002 | Weng |
| 6,473,878 | B1 | 10/2002 | Wei |
| 6,535,553 | B1 | 3/2003 | Limberg et al. |
| 6,625,775 | B1 | 9/2003 | Kim |
| 6,748,034 | B2 | 6/2004 | Hattori |
| 6,757,862 | B1 | 6/2004 | Marianetti, II |
| 6,785,863 | B2 | 8/2004 | Blankenship |
| 6,810,502 | B2 | 10/2004 | Eidson |
| 6,970,511 | B1 | 11/2005 | Barnette |
| 6,986,098 | B2 | 1/2006 | Poeppelman |
| 7,047,474 | B2 | 5/2006 | Rhee |
| 7,058,873 | B2 | 6/2006 | Song |
| 7,073,118 | B2 | 7/2006 | Greenberg |
| 7,093,179 | B2 | 8/2006 | Shea |
| 7,117,427 | B2 | 10/2006 | Ophir |
| 7,133,228 | B2 | 11/2006 | Fung |
| 7,184,486 | B1 | 2/2007 | Wu |
| 7,191,378 | B2 | 3/2007 | Eroz |
| 7,203,887 | B2 | 4/2007 | Eroz |
| 7,308,061 | B1 | 12/2007 | Huang |
| 7,310,768 | B2 | 12/2007 | Eidson |
| 7,313,750 | B1 | 12/2007 | Feng |
| 7,370,258 | B2 | 5/2008 | Iancu |
| 7,415,651 | B2 | 8/2008 | Argon |
| 7,502,189 | B2 | 3/2009 | Sawaguchi |
| 7,523,375 | B2 | 4/2009 | Spencer |
| 7,587,657 | B2 | 9/2009 | Haratsch |
| 7,590,168 | B2 | 9/2009 | Raghavan |
| 7,646,829 | B2 | 1/2010 | Ashley |
| 7,702,986 | B2 | 4/2010 | Bjerke |
| 7,752,523 | B1 | 7/2010 | Chaichanavong |
| 7,779,325 | B2 | 8/2010 | Song |
| 7,802,172 | B2 | 9/2010 | Vila Casado et al. |
| 7,952,824 | B2 | 5/2011 | Dziak |
| 7,958,425 | B2 | 6/2011 | Chugg |
| 7,996,746 | B2 | 8/2011 | Livshitz |
| 8,018,360 | B2 | 9/2011 | Nayak |
| 8,201,051 | B2 | 6/2012 | Tan |
| 8,237,597 | B2 | 8/2012 | Liu |
| 8,261,171 | B2 | 9/2012 | Annampedu |
| 8,291,283 | B1 * | 10/2012 | Rad et al. ............ 714/752 |
| 8,291,284 | B2 | 10/2012 | Savin |
| 8,291,292 | B1 * | 10/2012 | Varnica et al. ......... 714/758 |
| 8,295,001 | B2 | 10/2012 | Liu |
| 8,473,806 | B1 * | 6/2013 | Rad et al. ............ 714/752 |
| 2008/0069373 | A1 | 3/2008 | Jiang |
| 2008/0304558 | A1 | 12/2008 | Zhu et al. |
| 2009/0132893 | A1 | 5/2009 | Miyazaki |
| 2009/0185643 | A1 | 7/2009 | Fitzpatrick |
| 2011/0167227 | A1 | 7/2011 | Yang |
| 2011/0264987 | A1 | 10/2011 | Li |
| 2012/0124118 | A1 | 5/2012 | Ivkovic |
| 2012/0182643 | A1 | 7/2012 | Zhang |
| 2012/0207201 | A1 | 8/2012 | Xia |
| 2012/0212849 | A1 | 8/2012 | Xu |
| 2012/0262814 | A1 | 10/2012 | Li |
| 2012/0265488 | A1 | 10/2012 | Sun |

OTHER PUBLICATIONS

Bahl et al., "Optimal decoding of linear codes for minimizing symbol error rate", IEEE Trans. Inform. Theory, vol. 20, pp. 284-287 (Mar. 1974).

Blaum, "High-Rate Modulation Codes for Reverse Concatenation", IEEE Transactions on Magnetics, vol. 43, No. 2 (Feb. 2007).

Casado et al., Multiple-rate low- density parity-check codes with constant blocklength, IEEE Transations on communications, Jan. 2009, vol. 57, pp. 75-83.

Cui et al., "High-Throughput Layered LDPC Decoding Architecture", IEEE Transactions on Very Large Scale Integration (VLSI) Systems, vol. 17, No. 4 (Apr. 2009).

Fan et al., "Constrained coding techniques for soft iterative decoders" Proc. IEEE Global Telecommun. Conf., vol. 1b, pp. 631-637 (1999).

Fossorier, Marc P.C. "Quasi-Cyclic Low-Density Parity-Check Codes From Circulant Permutation Maricies" IEEE Transactions on Information Theory, vol. 50, No. 8 Aug. 8, 2004.

Gross, "Stochastic Decoding of LDPC Codes over GF(q)", HDPCC Workshop, Tel Aviv (Mar. 2, 2010).

Gunnam et al., "VLSI Architectures for Layered Decoding for Irregular LDPC Codes of WiMax", IEEE ICC Proceedings (2007).

Hagenauer, J. et al A Viterbi Algorithm with Soft-Decision Outputs and its Applications in Proc. IEEE Globecom, pp. 47. 11-47 Dallas, TX Nov. 1989.

Han and Ryan, "Pinning Techniques for Low-Floor Detection/Decoding of LDPC-Coded Partial Response Channels", 5th International Symposium on Turbo Codes &Related Topics, 2008.

Kautz, "Fibonacci Codes for Synchronization Control", IEEE Trans. Info. Theory, vol. 11, No. 2, pp. 284-292 (Apr. 1965).

Kschischang et al., "Factor Graphs and the Sum-Product Algorithm", IEEE Transactions on Information Theory, vol. 47, No. 2 (Feb. 2001).

Leduc-Primeau et al., "A Relaxed Half-Stochastic Iterative Decoder for LDPC Codes", IEEE Communications Society, IEEE Globecom proceedings (2009).

Lee et al., "Partial Zero-Forcing Adaptive MMSE Receiver for DS-CDMA Uplink in Multicell Environments" IEEE Transactions on Vehicular Tech. vol. 51, No. 5, Sep. 2002.

Li et al "Efficient Encoding of Quasi-Cyclic Low-Density Parity Check Codes" IEEE Transactions on Communications on 53 (11) 1973-1973, 2005.

Lim et al. "Convergence Analysis of Constrained Joint Adaptation in Recording Channels" IEEE Trans. on Signal Processing vol. 54, No. 1 Jan. 2006.

Lin et al "An efficient VLSI Architecture for non binary LDPC decoders"—IEEE Transaction on Circuits and Systems II vol. 57, Issue 1 (Jan. 2010) pp. 51-55.

Moon et al, "Pattern-dependent noise prediction in signal-dependent Noise," IEEE JSAC, vol. 19, No. 4 pp. 730-743, Apr. 2001.

Moon et al., "Maximum transition run codes for data storage systems", IEEE Trans. Magn., vol. 32, No. 5, pp. 3992-3994 (Sep. 1996).

Shokrollahi "LDPC Codes: An Introduction", Digital Fountain, Inc. (Apr. 2, 2003).

Spagnol et al, "Hardware Implementation of GF(2m) LDPC Decoders", IEEE Transactions on Circuits and Systemsŝi: Regular Papers, vol. 56, No. 12 (Dec. 2009).

Tehrani et al., "Fully Parallel Stochastic LDPC Decoders", IEEE Transactions on Signal Processing, vol. 56, No. 11 (Nov. 2008).

Todd et al., "Enforcing maximum-transition-run code constraints and low-density parity check decoding", IEEE Trans. Magn., vol. 40, No. 6, pp. 3566-3571 (Nov. 2004).

U.S. Appl. No. 13/340,974, Unpublished filed Dec. 30, 2011 Dan Liu.

U.S. Appl. No. 13/340,951, Unpublished filed Dec. 30, 2011 Lei Chen.

U.S. Appl. No. 13/113,219, Unpublished filed May 23, 2011 Yang Han.

U.S. Appl. No. 13/180,495, Unpublished filed Jul. 11, 2011 Chung-Li Wang.

U.S. Appl. No. 13/300,078, Unpublished filed Nov. 18, 2011 Chung-Li Wang.

U.S. Appl. No. 13/227,416, Unpublished filed Sep. 7, 2011 Lei Chen.

U.S. Appl. No. 13/305,551, Unpublished filed Nov. 28, 2011 Yang Han.

U.S. Appl. No. 13/174,537, Unpublished filed Jun. 30, 2011 Anantha Raman Krishnan.

U.S. Appl. No. 13/296,022, Unpublished filed Nov. 14, 2011 Victor Krachkovsky.

U.S. Appl. No. 13/302,119, Unpublished filed Nov. 22, 2011 Lei Chen.

U.S. Appl. No. 13/283,549, Unpublished filed Oct. 27, 2011 Wu Chang.

U.S. Appl. No. 13/213,751, Unpublished filed Aug. 19, 2011 Fan Zhang.

U.S. Appl. No. 13/227,544, Unpublished filed Sep. 8, 2011 Shaohua Yang.

(56) References Cited

OTHER PUBLICATIONS

U.S. Appl. No. 13/316,858, Unpublished filed Dec. 12, 2011 Zongwang Li.
U.S. Appl. No. 13/362,409, Unpublished filed Jan. 31, 2012 Fan Zhang.
U.S. Appl. No. 13/174,453, Unpublished filed Jun. 30, 2011 Johnson Yen.
U.S. Appl. No. 13/284,767, Unpublished filed Oct. 28, 2011 Fan Zhang.
U.S. Appl. No. 13/305,510, Unpublished filed Nov. 28, 2011 Lei Chen.
U.S. Appl. No. 13/171,615, Unpublished filed Jun. 29, 2011 Bradley D. Seago.
U.S. Appl. No. 13/327,279, Unpublished filed Dec. 15, 2011 Wei Feng.
U.S. Appl. No. 13/239,683, Unpublished filed Sep. 22, 2011 Changyou Xu.
U.S. Appl. No. 13/269,832, Unpublished filed Oct. 10, 2011 Haitao Xia.
U.S. Appl. No. 13/295,150, Unpublished filed Nov. 14, 2011 Zongwang Li.
U.S. Appl. No. 13/284,730, Unpublished filed Oct. 28, 2011 Fan Zhang.
U.S. Appl. No. 13/269,852, Unpublished filed Oct. 10, 2011 Haitao Xia.
U.S. Appl. No. 13/186,234, Unpublished filed Jul. 19, 2011 Haitao Xia.
U.S. Appl. No. 13/316,741, Unpublished filed Dec. 12, 2011 Yang Han.
Vasic, B., "High-Rate Girth-Eight Codes on Rectangular Integer Lattices", IEEE Trans. Communications, vol. 52, Aug. 2004, pp. 1248-1252.
Vasic, B., "High-Rate Low-Density Parity-Check Codes Based on Anti-Pasch Affine Geometries," Proc ICC 2002, pp. 1332-1336.
Weon-Cheol Lee et al., "Vitierbi Decoding Method Using Channel State Info. in COFDM System" IEEE Trans. on Consumer Elect., IEEE Service Center, NY, NY vol. 45, No. 3 Aug. 1999.
Yeo et al., "VLSI Architecture for Iterative Decoders in Magnetic Storage Channels", Mar. 2001, pp. 748-755, IEEE trans. Magnetics, vol. 37, No. 2.
Zhang et al., "Analysis of Verification-Based Decoding on the q-ary Symmetric Channel for Large q", IEEE Trans. on Information Theory, vol. 57, No. 10 (Oct. 2011).
Zhong et al., "High-Rate Quasi-Cyclic LDPC Codes for Magnetic Recording Channel with Low Error Floor", ISCAS, IEEE pp. 3546-3549, May 2006.
Zhong et al., "Joint Code-Encoder Design for LDPC Coding System VSLI Implementation", ISCAS, IEEE pp. 389-392, May 2004.
Zhong et al., "Design of VLSI Implementation-Oriented LDPC Codes", IEEE, pp. 670-673, 2003.
Zhong et al., "Quasi Cyclic LDPC Codes for the Magnetic Recording Channel: Code Design and VSLI Implementation", IEEE Transactions on Magnetics, v. 43, pp. 1118-1123, Mar. 7.
Zhong, "Block-LDPC: A Practical LDPC Coding System Design Approach", IEEE Trans. on Circuits, Regular Papers, vol. 5, No. 4, pp. 766-775, Apr. 2005.

\* cited by examiner

NON-BINARY LDPC DECODER WITH LOW LATENCY SCHEDULING

BACKGROUND

Various embodiments of the present invention are related to systems and methods for data processing, and more particularly to systems and methods for data decoding.

Various data processing systems have been developed including storage systems, cellular telephone systems, and radio transmission systems. In such systems data is transferred from a sender to a receiver via some medium. For example, in a storage system, data is sent from a sender (i.e., a write function) to a receiver (i.e., a read function) via a storage medium. As information is stored and transmitted in the form of digital data, errors are introduced that, if not corrected, can corrupt the data and render the information unusable. The effectiveness of any transfer is impacted by any losses in data caused by various factors. Many types of error checking systems have been developed to detect and correct errors in digital data. For example, in perhaps the simplest system, a parity bit can be added to a group of data bits, ensuring that the group of data bits (including the parity bit) has either an even or odd number of ones. When using odd parity, as the data is prepared for storage or transmission, the number of data bits in the group that are set to one are counted, and if there is an even number of ones in the group, the parity bit is set to one to ensure that the group has an odd number of ones. If there is an odd number of ones in the group, the parity bit is set to zero to ensure that the group has an odd number of ones. After the data is retrieved from storage or received from transmission, the parity can again be checked, and if the group has an even parity, at least one error has been introduced in the data. At this simplistic level, some errors can be detected but not corrected.

The parity bit may also be used in error correction systems, including in Low Density Parity Check (LDPC) decoders. An LDPC code is a parity-based code that can be visually represented in a Tanner graph 100 as illustrated in FIG. 1. In an LDPC decoder, multiple parity checks are performed in a number of check nodes 102, 104, 106 and 108 for a group of variable nodes 110, 112, 114, 116, 118, 120, 122, and 124. The connections (or edges) between variable nodes 110-124 and check nodes 102-108 are selected as the LDPC code is designed, balancing the strength of the code against the complexity of the decoder required to execute the LDPC code as data is obtained. The number and placement of parity bits in the group are selected as the LDPC code is designed. Messages are passed between connected variable nodes 110-124 and check nodes 102-108 in an iterative process, passing beliefs about the values that should appear in variable nodes 110-124 to connected check nodes 102-108. Parity checks are performed in the check nodes 102-108 based on the messages and the results are returned to connected variable nodes 110-124 to update the beliefs if necessary. LDPC decoders may be implemented in binary or non-binary fashion. In a binary LDPC decoder, variable nodes 110-124 contain scalar values based on a group of data and parity bits that are retrieved from a storage device, received by a transmission system or obtained in some other way. Messages in the binary LDPC decoders are scalar values transmitted as plain-likelihood probability values or log-likelihood-ratio (LLR) values representing the probability that the sending variable node contains a particular value. In a non-binary LDPC decoder, variable nodes 110-124 contain symbols from a Galois Field, a finite field $GF(p^k)$ that contains a finite number of elements, characterized by size $p^k$ where p is a prime number and k is a positive integer. Messages in the non-binary LDPC decoders are multi-dimensional vectors, generally either plain-likelihood probability vectors or LLR vectors.

The connections between variable nodes 110-124 and check nodes 102-108 may be presented in matrix form as follows, where columns represent variable nodes, rows represent check nodes, and a random non-zero element a(i,j) from the Galois Field at the intersection of a variable node column and a check node row indicates a connection between that variable node and check node and provides a permutation for messages between that variable node and check node:

$$H = \begin{bmatrix} a(1,1) & 0 & 0 & a(1,2) & 0 & a(1,3) & a(1,4) & 0 \\ 0 & a(2,1) & 0 & 0 & a(2,2) & 0 & 0 & a(2,3) \\ a(3,1) & 0 & a(3,2) & 0 & a(3,3) & a(3,4) & 0 & a(3,5) \\ 0 & a(4,1) & 0 & a(4,2) & 0 & 0 & a(4,3) & a(4,4) \end{bmatrix}$$

By providing multiple check nodes 102-108 for the group of variable nodes 110-124, redundancy in error checking is provided, enabling errors to be corrected as well as detected. Each check node 102-108 performs a parity check on bits or symbols passed as messages from its neighboring (or connected) variable nodes. In the example LDPC code corresponding to the Tanner graph 100 of FIG. 1, check node 102 checks the parity of variable nodes 110, 116, 120 and 122. Values are passed back and forth between connected variable nodes 110-124 and check nodes 102-108 in an iterative process until the LDPC code converges on a value for the group of data and parity bits in the variable nodes 110-124. For example, variable node 110 passes messages to check nodes 102 and 106. Check node 102 passes messages back to variable nodes 110, 116, 120 and 122. The messages between variable nodes 110-124 and check nodes 102-108 are probabilities or beliefs, thus the LDPC decoding algorithm is also referred to as a belief propagation algorithm. Each message from a node represents the probability that a bit or symbol has a certain value based on the current value of the node and on previous messages to the node.

A message from a variable node to any particular neighboring check node is computed using any of a number of algorithms based on the current value of the variable node and the last messages to the variable node from neighboring check nodes, except that the last message from that particular check node is omitted from the calculation to prevent positive feedback. Similarly, a message from a check node to any particular neighboring variable node is computed based on the current value of the check node and the last messages to the check node from neighboring variable nodes, except that the last message from that particular variable node is omitted from the calculation to prevent positive feedback. As local decoding iterations are performed in the system, messages pass back and forth between variable nodes 110-124 and check nodes 102-108, with the values in the nodes 102-124 being adjusted based on the messages that are passed, until the values converge and stop changing or until processing is halted.

Delays may be incurred when check nodes are waiting for messages from variable nodes and when variable nodes are waiting for messages from check nodes. A need therefore remains in the art for data decoders which avoid such delays.

BRIEF SUMMARY

The present inventions are related to systems and methods for decoding data, and more particularly to systems and methods for decoding of non-binary non-layer LDPC codes with low latency scheduling of variable node unit (VNU) updates. In some embodiments, an LDPC decoder is disclosed that includes a VNU operable to perform variable node updates based at least in part on check node to variable node (C2V) message vectors, a CNU operable to perform check node updates and to generate the C2V message vectors, and a scheduler operable to cause the VNU to use C2V message vectors from multiple decoding iterations when performing the variable node updates for a given decoding iteration. The scheduler is operable in some embodiments to cause the VNU and CNU to each perform successive decoding iterations without idle cycles between the successive decoding iterations by switching the VNU from C2V message vectors from an older iteration to C2V message vectors from an immediately preceding iteration as soon as they are available.

Some embodiments provide a method for decoding non-binary LDPC encoded data, including generating C2V messages for a current decoding iteration in a CNU, and performing variable node updates for a next decoding iteration in a VNU based in part on C2V messages for a previous decoding iteration while the CNU is generating C2V messages for a current decoding iteration, and further based in part on the C2V messages for the current decoding iteration. In some instances, the method includes switching from the C2V messages for the previous decoding iteration to the C2V messages for the current decoding iteration when the CNU completes the C2V messages for the current decoding iteration.

Some embodiments provide a storage system including a storage medium maintaining a data set, a read/write head assembly operable to sense the data set on the storage medium and to provide an analog output corresponding to the data set, an analog to digital converter operable to sample a continuous signal to yield a digital output, and a low density parity check decoder operable to decode the digital output. The low density parity check decoder includes a variable node processor operable to perform variable node updates based at least in part on check node to variable node message vectors, a check node processor operable to perform check node updates and to generate the check node to variable node message vectors, and a scheduler operable to cause the variable node processor to use check node to variable node message vectors from multiple decoding iterations when performing the variable node updates for a given decoding iteration.

This summary provides only a general outline of some embodiments according to the present invention. Many other objects, features, advantages and other embodiments of the present invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals may be used throughout several drawings to refer to similar components. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

The present inventions are related to systems and methods for decoding data, and more particularly to systems and methods for decoding of non-binary LDPC codes with low latency scheduling of variable node unit (VNU) updates. The LDPC decoder used in various embodiments may be, but is not limited to, a non-binary min-sum based non-layer LDPC decoder. The non-binary LDPC decoding provides efficient correction of burst errors, grouping many bits of a burst error inside a multi-bit data symbol. The non-binary LDPC also provides iterative decoding with superior error recovery performance than bit level iterative systems. By scheduling VNU updates in the LDPC decoder as disclosed herein, idle cycles while the check node unit (CNU) and VNU wait on messages are avoided and decoding latency is reduced. The term "low latency scheduling" is used herein to refer to VNU update scheduling which enables the VNU to begin processing of a local iteration before all data for that iteration is available from a CNU. This reduces decoding latency by enabling the VNU to begin decoding updates rather than idling while waiting for data from the CNU.

In some embodiments, the term "low latency scheduling" is used to refer to VNU update scheduling which causes VNU updates for a particular iteration to be performed based on C2V messages from multiple iterations. The terms "variable node unit" and "variable node processor" are used interchangeably herein to refer to one or more circuits, code or devices operable to perform variable node updates and generate variable node to check node messages. The terms "check node unit" and "check node processor" are used interchangeably herein to refer to one or more circuits, code or devices operable to perform check node updates and generate check node to variable node messages. The terms "variable node updates" or "VNU updates" are used herein to refer to updating the perceived values for data symbols based in part on C2V messages. In some instances, the terms "variable node updates" or "VNU updates" may also refer to the generation of V2C messages. The terms "check node updates" or "CNU updates" are used herein to refer to the updating of check node values based in part on V2C messages. In some instances, the terms "check node updates" or "CNU updates" may also refer to the generation of C2V messages.

Figure 2:
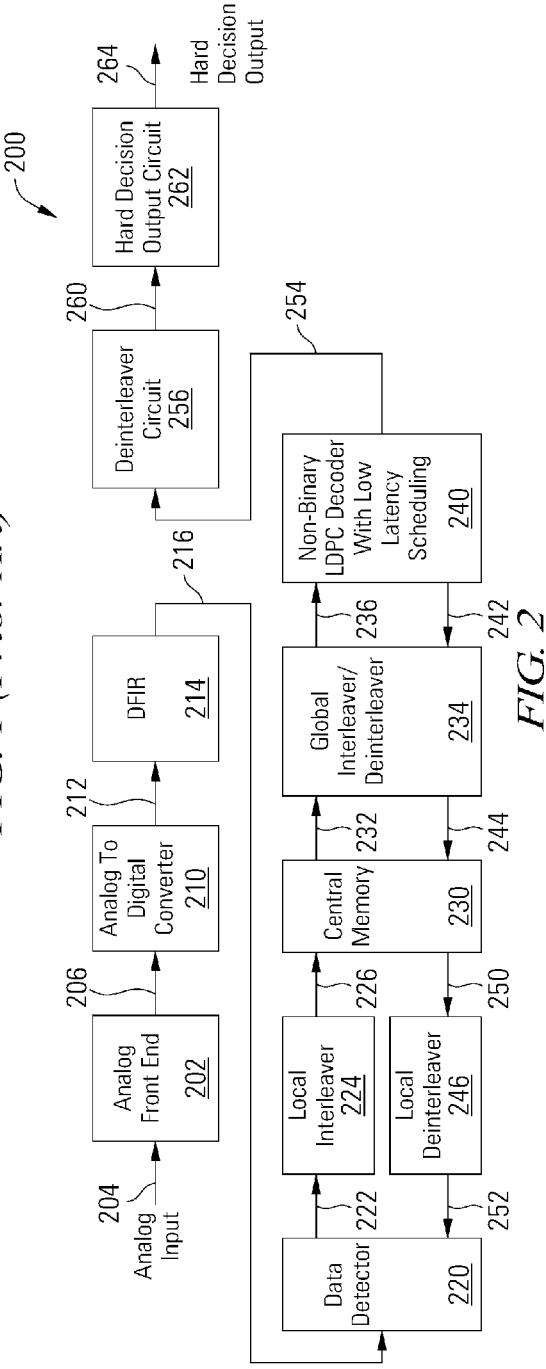
FIG. 2 depicts a data processing circuit including a non-binary LDPC decoder with low latency scheduling in accordance with one or more embodiments of the present invention.

Turning to FIG. 2, a data processing circuit 200 is shown that includes a non-binary LDPC decoder with low latency scheduling 240 that is operable to decode received codewords in accordance with one or more embodiments of the present inventions. Data processing circuit 200 includes an analog front end circuit 202 that receives an analog signal 204. Analog front end circuit 202 processes analog signal 204 and provides a processed analog signal 206 to an analog to digital converter circuit 210. Analog front end circuit 202 may include, but is not limited to, an analog filter and an amplifier circuit as are known in the art. Based upon the disclosure provided herein, one of ordinary skill in the art will recognize a variety of circuitry that may be included as part of analog front end circuit 202. In some cases, analog signal 204 is derived from a read/write head assembly (not shown) that is disposed in relation to a storage medium (not shown). In other cases, analog signal 204 is derived from a receiver circuit (not shown) that is operable to receive a signal from a transmission medium (not shown). The transmission medium may be wired or wireless. Based upon the disclosure provided herein, one of ordinary skill in the art will recognize a variety of source from which analog input 204 may be derived.

Analog to digital converter circuit 210 converts processed analog signal 206 into a corresponding series of digital samples 212. Analog to digital converter circuit 210 may be any circuit known in the art that is capable of producing digital samples corresponding to an analog input signal. Based upon the disclosure provided herein, one of ordinary skill in the art will recognize a variety of analog to digital converter circuits that may be used in relation to different embodiments of the present invention. Digital samples 212 are provided to an equalizer circuit 214. Equalizer circuit 214 applies an equalization algorithm to digital samples 212 to yield an equalized output 216. In some embodiments of the present invention, equalizer circuit 214 is a digital finite impulse response filter circuit as are known in the art. In some cases, equalizer 214 includes sufficient memory to maintain one or more codewords until a data detector circuit 220 is available for processing. It may be possible that equalized output 216 may be received directly from a storage device in, for example, a solid state storage system. In such cases, analog front end circuit 202, analog to digital converter circuit 210 and equalizer circuit 214 may be eliminated where the data is received as a digital data input.

Data detector circuit 220 is operable to apply a data detection algorithm to a received codeword or data set, and in some cases data detector circuit 220 can process two or more codewords in parallel. In some embodiments of the present invention, data detector circuit 220 is a Viterbi algorithm data detector circuit as is known in the art. In other embodiments of the present invention, data detector circuit 220 is a maximum a posteriori data detector circuit as is known in the art. Of note, the general phrases "Viterbi data detection algorithm" or "Viterbi algorithm data detector circuit" are used in their broadest sense to mean any Viterbi detection algorithm or Viterbi algorithm detector circuit or variations thereof including, but not limited to, bi-direction Viterbi detection algorithm or bi-direction Viterbi algorithm detector circuit. Also, the general phrases "maximum a posteriori data detection algorithm" or "maximum a posteriori data detector circuit" are used in their broadest sense to mean any maximum a posteriori detection algorithm or detector circuit or variations thereof including, but not limited to, simplified maximum a posteriori data detection algorithm and a max-log maximum a posteriori data detection algorithm, or corresponding detector circuits. Based upon the disclosure provided herein, one of ordinary skill in the art will recognize a variety of data detector circuits that may be used in relation to different embodiments of the present invention. Data detector circuit 220 is started based upon availability of a data set from equalizer circuit 214 or from a central memory circuit 230.

Upon completion, data detector circuit 220 provides detector output 222. Detector output 222 includes soft data. As used herein, the phrase "soft data" is used in its broadest sense to mean reliability data with each instance of the reliability data indicating a likelihood that a corresponding bit position or group of bit positions has been correctly detected. In some embodiments of the present invention, the soft data or reliability data is log likelihood ratio data as is known in the art. Detected output 222 is provided to a local interleaver circuit 224. Local interleaver circuit 224 is operable to shuffle sub-portions (i.e., local chunks) of the data set included as detected output 222 and provides an interleaved codeword 226 that is stored to central memory circuit 230. Interleaver circuit 224 may be any circuit known in the art that is capable of shuffling data sets to yield a re-arranged data set. Interleaved codeword 226 is stored to central memory circuit 230.

Once non-binary LDPC decoder with low latency scheduling 240 is available, a previously stored interleaved codeword 226 is accessed from central memory circuit 230 as a stored codeword 232 and globally interleaved by a global interleaver/de-interleaver circuit 234. Global interleaver/De-interleaver circuit 234 may be any circuit known in the art that is capable of globally rearranging codewords. Global interleaver/De-interleaver circuit 234 provides a decoder input 236 into non-binary LDPC decoder with low latency scheduling 240. In some embodiments of the present invention, the data decode algorithm is a non-binary non-layer min-sum based low density parity check algorithm. Based upon the disclosure provided herein, one of ordinary skill in the art will recognize other decode algorithms that may be used in relation to different embodiments of the present invention. The non-binary LDPC decoder with low latency scheduling 240 may be implemented similar to that described below in relation to FIGS. 3-5. The non-binary LDPC decoder with low latency scheduling 240 applies a data decode algorithm to decoder input 236 in a variable number of local iterations.

Where the non-binary LDPC decoder with low latency scheduling 240 fails to converge (i.e., fails to yield the originally written data set) and a number of local iterations through non-binary LDPC decoder with low latency scheduling 240 exceeds a threshold, the resulting decoded output is provided as a decoded output 242 back to central memory circuit 230 where it is stored awaiting another global iteration through data detector circuit 220 and non-binary LDPC decoder with low latency scheduling 240. Prior to storage of decoded output 242 to central memory circuit 230, decoded output 242 is globally de-interleaved to yield a globally de-interleaved output 244 that is stored to central memory circuit 230. The global de-interleaving reverses the global interleaving earlier applied to stored codeword 232 to yield decoder input 236. Once data detector circuit 220 is available, a previously stored de-interleaved output 244 is accessed from central memory circuit 230 and locally de-interleaved by a de-interleaver circuit 246. De-interleaver circuit 246 re-arranges decoder output 250 to reverse the shuffling originally performed by interleaver circuit 224. A resulting de-interleaved output 252 is provided to data detector circuit 220 where it is used to guide subsequent detection of a corresponding data set received as equalized output 216.

Alternatively, where the decoded output converges (i.e., yields the originally written data set) in the non-binary LDPC decoder with low latency scheduling 240, the resulting decoded output is provided as an output codeword 254 to a de-interleaver circuit 256. De-interleaver circuit 256 rearranges the data to reverse both the global and local interleaving applied to the data to yield a de-interleaved output 260. De-interleaved output 260 is provided to a hard decision output circuit 262. Hard decision output circuit 262 is operable to re-order data sets that may complete out of order back into their original order. The originally ordered data sets are then provided as a hard decision output 264.

In a conventional non-binary min-sum LDPC decoder with GF(q) and with p check node rows in the parity check matrix, check node processing involves both forward and backward recursions that incur long latency since they require about $q^2$ additions and comparisons in each of p-2 basic steps. To perform both forward and backward recursions, numerous intermediate messages are stored, requiring a large memory, and messages are sorted when combining the results of forward and backward recursions. In contrast, the min-sum based decoding of non-binary LDPC codes disclosed herein provides low-complexity decoding that does not require forward and backward recursions, sorting or dynamic programming. By including message normalization and modification of the search space, searching over various local configurations is reduced to the simple recursive processing of a single message vector.

Figure 1:
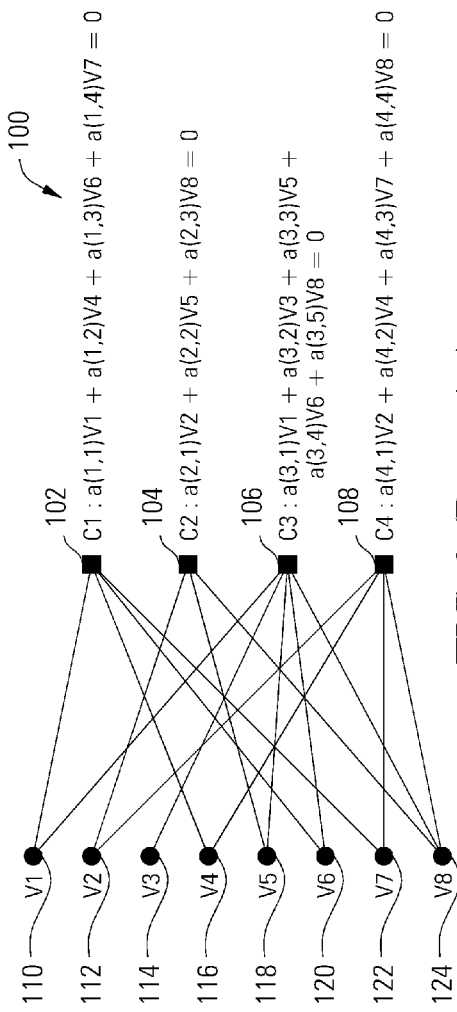
FIG. 1 depicts a Tanner graph of an example prior art LDPC code.

Check nodes (implemented in a check node processor or check node unit CNU) in a min-sum based non-binary LDPC decoder receive incoming messages from connected or neighboring variable nodes and generate outgoing messages to each neighboring variable node to implement the parity check matrix for the LDPC code, an example of which is graphically illustrated in the Tanner graph of FIG. 1. Incoming messages to check nodes are also referred to herein as V2C messages, indicating that they flow from variable nodes to check nodes, and outgoing messages from check nodes are also referred to herein as C2V messages, indicating that they flow from check nodes to variable nodes. The check node uses multiple V2C messages to generate an individualized C2V message for each neighboring variable node.

Both V2C and C2V messages are vectors, each including a number of sub-messages with LLR values. Each V2C message vector from a particular variable node will contain sub-messages corresponding to each symbol in the Galois Field, with each sub-message giving the likelihood that the variable node contains that particular symbol. For example, given a Galois Field GF(q) with q elements, V2C and C2V messages will include at least q sub-messages representing the likelihood for each symbol in the field. Message normalization in the simplified min-sum decoding is performed with respect to the most likely symbol. Thus, the V2C and C2V vector format includes two parts, an identification of the most likely symbol and the LLR for the other q-1 symbols, since the most likely symbol has LLR equal to 0 after normalization.

Generally, the C2V vector message from a check node to a variable node contains the probabilities for each symbol d in the Galois Field that the destination variable node contains that symbol d, based on the prior round V2C messages from neighboring variable nodes other than the destination variable node. The inputs from neighboring variable nodes used in a check node to generate the C2V message for a particular neighboring variable node are referred to as extrinsic inputs and include the prior round V2C messages from all neighboring variable nodes except the particular neighboring variable node for which the C2V message is being prepared, in order to avoid positive feedback. The check node thus prepares a different C2V message for each neighboring variable node, using the different set of extrinsic inputs for each message based on the destination variable node.

In the simplified min-sum based decoding applied in some embodiments of the non-binary LDPC decoder with low latency scheduling disclosed herein, the check nodes calculate the minimum sub-message $\min_1(d)$, the index idx(d) of $\min_1(d)$, and the sub-minimum sub-message $\min_2(d)$, or minimum of all sub-messages excluding $\min_1(d)$, for each nonzero symbol d in the Galois Field based on all extrinsic V2C messages from neighboring variable nodes. In other words, the sub-messages for a particular symbol d are gathered from messages from all extrinsic inputs, and the $\min_1(d)$, idx(d) and $\min_2(d)$ is calculated based on the gathered sub-messages for that symbol d. For a Galois Field with q symbols, the check node will calculate the $\min_1(d)$, idx(d) and $\min_2(d)$ sub-message for each of the q-1 non-zero symbols in the field except the most likely symbol. The $\min_1(d)$, idx(d) and $\min_2(d)$ values are stored in a memory for use in calculating the C2V message, requiring much less memory than the traditional non-binary LDPC check node processor that stores each intermediate forward and backward message. Such a min-sum based non-binary LDPC decoder, in which the low latency scheduling disclosed herein may be applied, may decode data as disclosed in U.S. patent application Ser. No. 13/180,495, filed Jul. 11, 2011 for a "Min-Sum Based Non-Binary LDPC Decoder", which is incorporated herein for all purposes.

Figure 3:
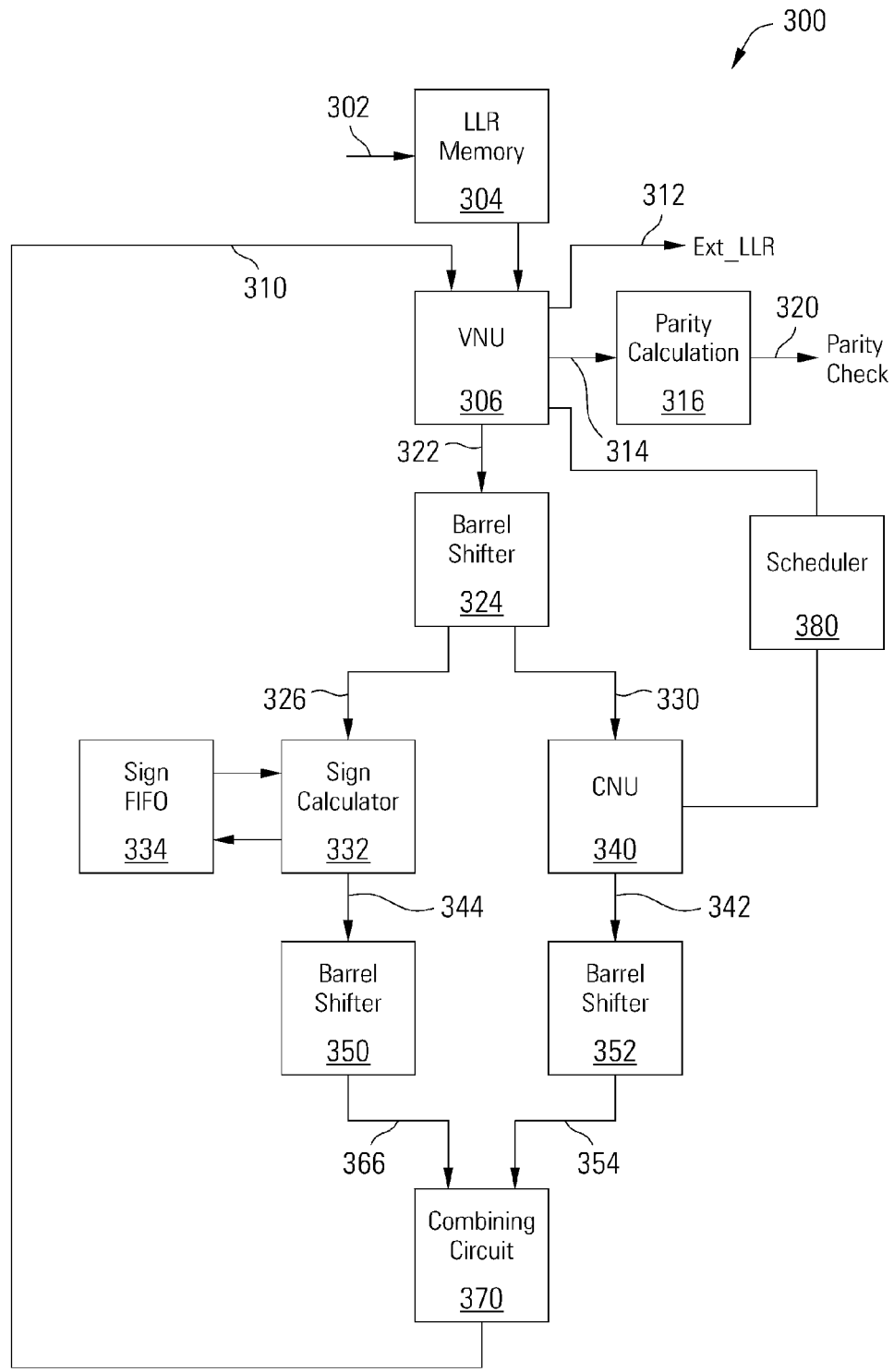
FIG. 3 depicts a non-binary LDPC decoder with low latency scheduling in accordance with various embodiments of the present invention.

Turning to FIG. 3, a non-binary LDPC decoder with low latency scheduling 300 is shown in accordance with various embodiments of the present inventions, applying the simplified min-sum based decoding disclosed above. Again, it is important to note that the non-binary LDPC decoder with low latency scheduling 300 is not limited to use with min-sum based decoding or to any particular LDPC decoding algorithm. The non-binary LDPC decoder with low latency scheduling 300 may be used in place of LDPC decoder 240 of FIG. 2.

The non-binary LDPC decoder with low latency scheduling 300 is provided with LLR values from an input channel 302, which may be stored in an LLR memory 304. The values are provided to the variable node processor or variable node unit (VNU) 306, which updates the perceived value of symbols based on the value from input channel 302 and on C2V message vectors 310. The VNU 306 yields an external LLR output 312, which may include a hard decision along with soft data, which may be processed in a de-interleaver circuit (e.g., 256) and a hard decision output circuit (e.g., 262) to generate a hard decision output from a data processing system. The VNU 306 also yields a decision output 314 that is provided to a parity calculation circuit 316 to generate a parity check output 320. For example, parity calculation circuit 316 may include multiplexers and XOR circuits to calculate parity check equation $\underline{v} \cdot H^T = \underline{0}$ over GF(q), where $\underline{v} \in GF(q)^N$, and where $\underline{v}$ is a codeword vector and $H^T$ is the transform of the H matrix for the LDPC decoder.

The VNU 306 performs an update function, adding C2V message vectors 310 to symbol values, and generates V2C message vectors 322 setting forth the updated likelihood for each element in the Galois Field for each symbol in the data set. The V2C message vectors 322 in some embodiments contains a hard decision, an indication of the most likely GF element, and LLR values for the remaining GF elements for each symbol, with the LLR values normalized to the hard decision. For example, the VNU 306 or an external sorting and normalization circuit (not shown) takes the four LLR data values from each symbol, identifies the highest LLR data value of the four values, and normalizes the four LLR data values to the value of the highest LLR data value. An example of this is shown using the following example symbol:

| Hard Decision | 00 | 01 | 10 | 11 |
|---|---|---|---|---|
| LLR Data Value | 10 | 15 | 22 | 6 |

In this example, the VNU 306 or external sorting and normalization circuit selects the LLR data value '22' corresponding to the hard decision '10'. Next, the LLR data values corresponding to hard decision values '00', '01', '10' and '11' are normalized to LLR data value '22' by subtracting '22' from each of the LLR data values to yield the following normalized symbol:

| Hard Decision | 00 | 01 | 10 | 11 |
|---|---|---|---|---|
| Normalized LLR Data Value | −12 | −7 | 0 | −16 |

The LLR values may also be scaled in VNU 306 or in an external scaling circuit (not shown), multiplying each of the normalized LLR data values by a scaling factor. The scaling factor may be user programmable. As an example, with a scaling factor of 0.5, the V2C message vectors 322 might include the following scaled symbol based on the current example:

| Hard Decision | 00 | 01 | 10 | 11 |
|---|---|---|---|---|
| Normalized LLR Data Value | −6 | −4 | 0 | −8 |

The V2C message vectors 322 are provided to a barrel shifter 324. In some embodiments, the code structure of the codeword provided at input channel 302 has a code structure matrix of the following form:

$$\begin{bmatrix} P_{1,1} & P_{1,2} & \ldots & P_{1,j} & \ldots & P_{1,L} \\ P_{2,1} & P_{2,2} & \ldots & P_{2,j} & \ldots & P_{2,L} \\ P_{3,1} & P_{2,2} & \ldots & P_{3,j} & \ldots & P_{3,L} \\ R_1 & R_2 & \ldots & R_j & \ldots & R_L \end{bmatrix}$$

$$R_j = \begin{bmatrix} q_{p_1 \times p_1}^{j+0} & q_{p_1 \times p_1}^{j+1} & \ldots & q_{p_1 \times p_1}^{j+k} \end{bmatrix}$$

where each of $P_{I,J}$ are pxp circulants with weight 1, or permutations of the identity matrix, and the circulant size L is the row weight. The following is an example of a pxp circulant representative of $P_{I,J}$:

$$P_{I,J} = \begin{bmatrix} 0 & \alpha & 0 & \ldots & 0 \\ 0 & 0 & \alpha & \ldots & 0 \\ \vdots & \vdots & \vdots & \ddots & \vdots \\ 0 & 0 & 0 & \ldots & \alpha \\ \alpha & 0 & 0 & \ldots & 0 \end{bmatrix}$$

The barrel shifter 324 is operable to shift the currently received circulant to an identity matrix. Such an identity matrix may be as follows:

$$P_{I,J} = \begin{bmatrix} \alpha & 0 & 0 & \ldots & 0 \\ 0 & \alpha & 0 & \ldots & 0 \\ \vdots & \vdots & \vdots & \ddots & \vdots \\ 0 & 0 & 0 & \ldots & 0 \\ 0 & 0 & 0 & \ldots & \alpha \end{bmatrix}$$

Barrel shifter 324 provides shifted outputs 326 and 330, where shifted output 326 contains the magnitude and sign of the hard decision HD, and shifted output 330 contains the magnitudes of the remaining LLR values, normalized to the hard decision HD. The shifted output 326 is provided to a sign calculation circuit 332 which calculates the accumulative sign for the hard decisions in shifted output 326, storing the resulting sign value of each non-zero element of the H matrix in a sign FIFO memory 334.

The shifted output 330 is provided to CNU 340, which calculates the first minimum LLR value or sub-message $\min_1(d)$, (i.e., the lowest LLR value), the index idx(d) of $\min_1(d)$ (i.e., the location in the row corresponding to the first minimum LLR data value), and the second minimum LLR value or sub-message $\min_2(d)$, (i.e., the second lowest LLR value) or minimum of all sub-messages excluding $\min_1(d)$, for each nonzero symbol d in the Galois Field based on all extrinsic V2C messages. In other words, the sub-messages for a particular symbol d are gathered from messages from all extrinsic inputs, and the $\min_1(d)$, idx(d) and $\min_2(d)$ is calculated based on the gathered sub-messages for that symbol d. For a Galois Field with q symbols, the check node will calculate the $\min_1(d)$, idx(d) and $\min_2(d)$ sub-message for each of the q-1 non-zero symbols in the field except the most likely symbol, the hard decision HD. Such a simplified min-sum based CNU 340 is referred to herein as a compression circuit. The CNU 340 selects as output 342 either the $\min_1(d)$ or $\min_2(d)$ to be used in the C2V message such that only extrinsic values are selected. If the current column index is equal to the index of the minimum value, meaning that the C2V message is being prepared for a variable node that provided the $\min_1(d)$ value, then the value of the C2V message is the second minimum value $\min_2(d)$. Otherwise, the value of the C2V message is the first minimum value $\min_1(d)$. With a code structure matrix having three rows, the CNU 340 or external buffer (not shown) would store three sets of first minimum LLR data value, second minimum LLR data value, index value as shown in the example below:

| Row 1 | First Minimum LLR Value |
| | Second Minimum LLR Value |
| | Index Value |
| Row 2 | First Minimum LLR Value |
| | Second Minimum LLR Value |
| | Index Value |
| Row 3 | First Minimum LLR Value |
| | Second Minimum LLR Value |
| | Index Value |

The hard decision HD and sign to be used in the C2V message is provided at the output 344 of sign calculation circuit 332, with the sign calculated as the XOR of the cumulative sign and the current sign of the symbol. The output 344 of sign calculation circuit 332 and the output 342 of CNU 340 are provided to barrel shifters 350 and 352, respectively, which shift the C2V message values in output 342 and the hard decisions and their signs in output 344 to yield shifted C2V message values 354 and shifted hard decisions and signs 366, respectively, shifting between circulant sub-matrices.

The shifted C2V message values 354 and shifted hard decisions and signs 366 are combined and processed in a combining circuit 370 to yield C2V message vectors 310. The combining circuit 370 is also referred to herein as a check node update and data decompression circuit, and reassembles rows to yield an approximation of the original data.

As will be disclosed in more detail below, a scheduler 380 controls the operation of the VNU 306 and CNU 340, scheduling when they perform the variable node updates and check node updates for each local iteration of data through the non-binary LDPC decoder with low latency scheduling 300. The term "local iteration" is used herein to refer to the processing of a block of data within the non-binary LDPC decoder with low latency scheduling 300, including passing V2C messages from VNU 306 to CNU 340 and C2V messages from CNU 340 to VNU 306, and performing variable node and check node updates in the VNU 306 and CNU 340. The scheduler 380 may comprise circuitry such as logic gates and/or state machines or firmware or other devices to detect when the VNU and CNU complete iterations. The scheduler 380 may also comprise circuitry, firmware or other devices to select C2V messages to be used by the VNU in performing VNU updates and generating V2C messages, for example switching between C2V messages from various iterations when performing VNU updates for a given iteration as the CNU completes an iteration. Based upon the disclosure provided herein, one of ordinary skill in the art will recognize a variety of circuitry or other devices that may be included as part of scheduler 380. The functions disclosed herein relating to scheduler 380 may be performed by a single device external to the VNU and CNU, or the functions may be distributed across multiple devices or fully or partially integrated into the VNU and/or CNU.

Figure 4:
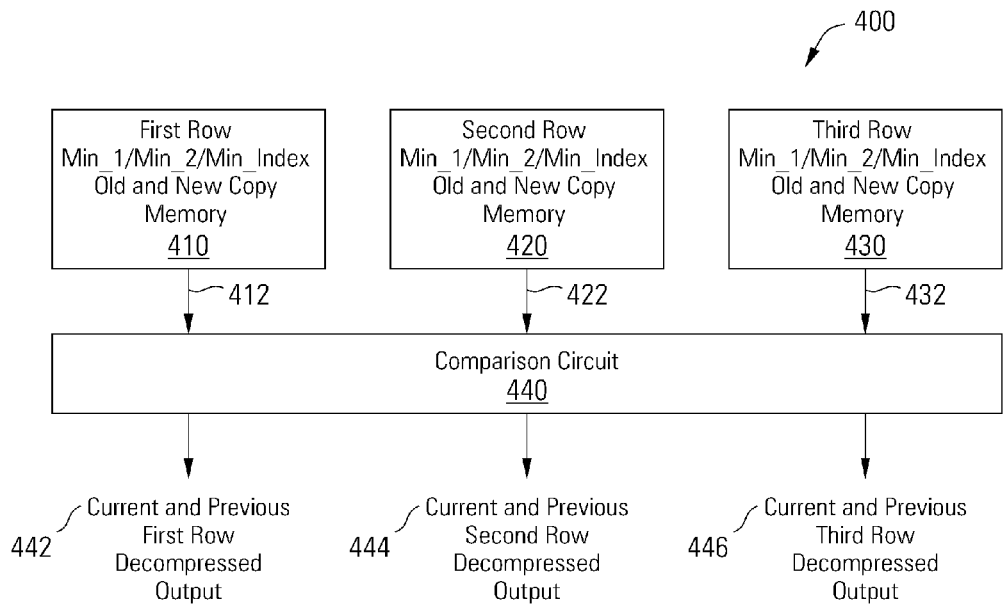
FIG. 4 depicts a decompression circuit that may be used in relation to one or more embodiments of the present invention.

FIG. 4 shows a check node update and data decompression circuit 400 that may be used to perform the check node updating and data decompression of combining circuit 370. Decompression circuit 400 includes a first row memory 410 that stores a current and previous set of first minimum LLR data value (Min11), second minimum LLR data value (Min12), index value (index1), and hard decision values received from CNU 340 and sign calculation circuit 332. Similarly, decompression circuit 400 includes a second row memory 420 that stores a current and previous set of first minimum LLR data value (Min21), second minimum LLR data value (Min22), index value (index2), and hard decision values received from CNU 340 and sign calculation circuit 332, and decompression circuit 400 includes a third row memory 430 that stores a current and previous set of first minimum LLR data value (Min31), second minimum LLR data value (Min32), index value (index3), and hard decision values received from CNU 340 and sign calculation circuit 332. The current and previous data is provided from first row memory 410 to a comparison circuit 440 as an output 412, the current and previous data is provided from second row memory 420 to comparison circuit 440 as an output 422, and the current and previous data is provided from third row memory 430 to comparison circuit 440 as an output 432. Comparison circuit 440 determines the elements of the reconstructed approximate values. In particular, comparison circuit 440 provides current and previous data for the first row as a current and previous first row de-compressed output 442, current and previous data for the second row as a current and previous second row de-compressed output 444, current and previous data for the second row as a current and previous second row de-compressed output 446.

In operation, the data is received by comparison circuit 440 one symbol from each row at a time (i.e., three symbols at a time). The index value (CI) for the currently received symbol of output 412, output 422 and output 432 is compared with the index values corresponding to the first minimum LLR data value for row one (index1), the first minimum LLR data value for row two (index2), and the first minimum LLR data value for row three (index3) to yield the comparison values: comparison row 1 (CR1), comparison row 2 (CR2) and comparison row 3 (CR3) in accordance with the following pseudocode:

```
If (CI == index1)
{
    CR1 = 1
}
Else
{
    CR1=0
}
If (CI == index2)
{
    CR2 = 1
}
Else
{
    CR2=0
}
If (CI == index3)
{
    CR3 = 1
}
Else
{
    CR3=0
}
```

These index values are then used to determine the values of current and previous first row de-compressed output 442 (CO1), current and previous second row de-compressed output 444 (CO2), and current and previous second row de-compressed output 446 (CO3) in accordance with the following table:

| CR1, CR2, CR3 | CO1 | CO2 | CO3 |
|---|---|---|---|
| 0, 0, 0 | If (Min11<Min21+Min31){<br>CO1=Min11}<br>Else {<br>CO1=Min21+Min31} | If (Min21<Min11+Min31){<br>CO2=Min21}<br>Else {<br>CO2=Min11+Min31} | If (Min31<Min11+Min21){<br>CO3=Min31}<br>Else {<br>CO3=Min11+Min21} |
| 0, 0, 1 | If (Min11<Min21+Min32){<br>CO1=Min11}<br>Else {<br>CO1=Min21+Min32} | If (Min21<Min11+Min32){<br>CO2=Min21}<br>Else {<br>CO2=Min11+Min32} | If (Min32<Min11+Min21){<br>CO3=Min32}<br>Else {<br>CO3=Min11+Min21} |
| 0, 1, 0 | If (Min11<Min22+Min31){<br>CO1=Min11}<br>Else {<br>CO1=Min22+Min31} | If (Min22<Min11+Min31){<br>CO2=Min22}<br>Else {<br>CO2=Min11+Min31} | If (Min31<Min11+Min22){<br>CO3=Min31}<br>Else {<br>CO3= Min11+Min22} |

| CR1, CR2, CR3 | CO1 | CO2 | CO3 |
|---|---|---|---|
| 0, 1, 1 | If (Min11<Min22+Min32){<br>    CO1=Min11}<br>Else {<br>    CO1=Min22+Min32} | If (Min22<Min11+Min32){<br>    CO2=Min22}<br>Else {<br>    CO2=Min11+Min32} | If (Min32<Min11+Min22){<br>    CO3=Min32}<br>Else {<br>    CO3= Min11+Min22} |
| 1, 0, 0 | If (Min12<Min21+Min31){<br>    CO1=Min11}<br>Else {<br>    CO1=Min21+Min31} | If (Min21<Min12+Min31){<br>    CO2=Min21}<br>Else {<br>    CO2=Min12+Min31} | If (Min31<Min12+Min21){<br>    CO3=Min31}<br>Else {<br>    CO3= Min12+Min21} |
| 1, 0, 1 | If (Min12<Min21+Min32){<br>    CO1=Min11}<br>Else {<br>    CO1=Min21+Min32} | If (Min21<Min12+Min32){<br>    CO2=Min21}<br>Else {<br>    CO2=Min12+Min32} | If (Min32<Min12+Min21){<br>    CO3=Min32}<br>Else {<br>    CO3= Min12+Min21} |
| 1, 1, 0 | If (Min12<Min22+Min31){<br>    CO1=Min11}<br>Else {<br>    CO1=Min22+Min31} | If (Min22<Min12+Min31){<br>    CO2=Min22}<br>Else {<br>    CO2=Min12+Min31} | If (Min31<Min12+Min22){<br>    CO3=Min31}<br>Else {<br>    CO3= Min12+Min22} |
| 1, 1, 1 | If (Min12<Min22+Min32){<br>    CO1=Min11}<br>Else {<br>    CO1=Min22+Min32} | If (Min22< Min12+Min32){<br>    CO2=Min22}<br>Else {<br>    CO2=Min12+Min32} | If (Min32< Min12+Min22){<br>    CO3=Min32}<br>Else {<br>    CO3= Min12+Min22} |

Figure 5:
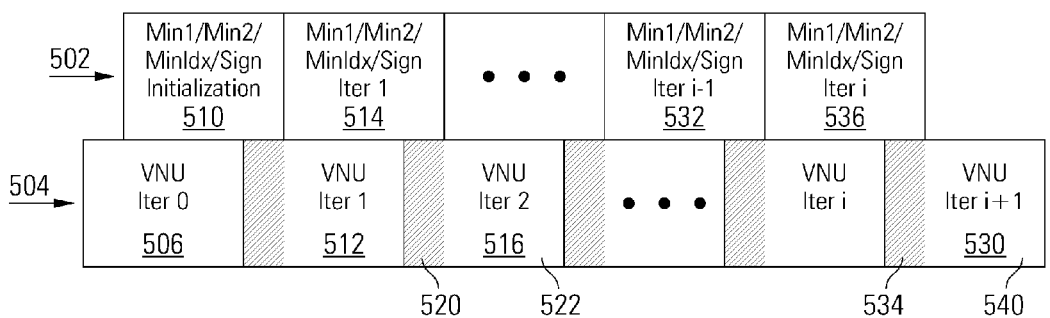
FIG. 5 depicts a variable node unit update schedule in accordance with some embodiments of the present invention.

Turning to FIG. 5, a VNU update schedule 500 is depicted in accordance with some embodiments of the present invention. The VNU update schedule 500 may be implemented by a scheduler in an LDPC decoder, such as the scheduler 380 in the non-binary LDPC decoder with low latency scheduling 300. The top row 502 generally shows operations in the CNU (e.g., 340), and the bottom row 504 shows operations in the VNU (306). The zero'th VNU iteration 506 is an initialization iteration which receives input LLR data (e.g., from input channel 302), but which does not perform VNU updates since there are no C2V messages to add. Shortly after the zero'th VNU iteration 506 begins, a CNU initialization operation 510 begins, receiving data from the input channel 302 via the VNU and preparing to perform check node updates by identifying and storing first and second minimum LLR data as disclosed above. Once the input LLR data has been copied by the VNU to the CNU in the zero'th VNU iteration 506, the VNU is available to begin the first VNU iteration 512. As with the zero'th VNU iteration 506, the VNU does not perform VNU updates during the first VNU iteration 512 because no C2V messages are available to add to symbol values. The VNU thus again copies the input LLR data to the CNU during the first VNU iteration 512.

Once the CNU initialization operation 510 is complete, the CNU is available to begin the first CNU iteration 514, identifying and storing first and second minimum LLR data as disclosed above and comparing previous data from VNU iteration 506 with current data from first VNU iteration 512 as disclosed above with respect to FIG. 4 and yielding C2V messages.

Although the VNU is available once the first VNU iteration 512 has been completed, the C2V messages from first CNU iteration 514 are not available before the first CNU iteration 514 is complete. However, rather than idling the VNU after the first VNU iteration 512 is complete while waiting for C2V messages when the first CNU iteration 514 is complete, the scheduler causes the VNU to begin the second VNU iteration 516. During the period 520 between the completion of first VNU iteration 512 and first CNU iteration 514 (represented by a shaded region in FIG. 5), the VNU performs variable node updates using C2V messages generated during CNU initialization operation 510. (Note that in some embodiments, the CNU does not generate C2V messages during the CNU initialization operation 510, and in these cases, the VNU will again be generating V2C messages based only on input LLR data without updating or adding C2V message data during period 520). Once the first CNU iteration 514 is complete and the C2V messages from iteration 1 are available, the scheduler causes the VNU to switch from C2V messages from CNU initialization operation 510 and instead use C2V messages from first CNU iteration 514 to complete the V2C messages for iteration 2 for the remaining period 522 of iteration 2.

Thus, a VNU iteration in the non-binary LDPC decoder with low latency scheduling generates V2C messages using C2V messages from multiple local decoding iterations, beginning with C2V messages from a past iteration (e.g., 510) and finishing with C2V messages from the previous iteration (e.g., 514). Notably, successive local decoding iterations are operating on the same block of input, so while scheduling VNU updates in this way adds in C2V message data from multiple different iterations to generate the next V2C messages, the overall decoding algorithm applied by the LDPC decoder is not changed by the VNU update scheduling disclosed herein.

VNU update scheduling continues in this manner until the local decoding operation is finished, for example because the data has converged or because the maximum number of local decoding iterations has been reached. As another illustration, the i+1'th VNU iteration 530 begins performing VNU updates using C2V messages generated during the i-1'th CNU iteration 532 during the period 534 before the i'th CNU iteration 536 is complete. Once the i'th CNU iteration 536 is complete, the VNU switches from C2V messages generated during the i'th CNU iteration 536 in period 540. In other words, the VNU calculates V2C messages for the i+1'th iteration 530 using C2V messages generated during the i-1'th CNU iteration 532 during period 534 for the first segment of the block of data being decoded and using C2V messages generated during the i'th CNU iteration 536 during period 540 for the remaining segment of the block of data being decoded.

The VNU update scheduling disclosed herein reduces latency by avoiding idle cycles that might otherwise be introduced to the VNU while waiting for the CNU to complete the previous iteration. The VNU is allowed to immediately continue performing the next iteration, using C2V messages from an iteration before that still being processed by the CNU.

Figure 6:
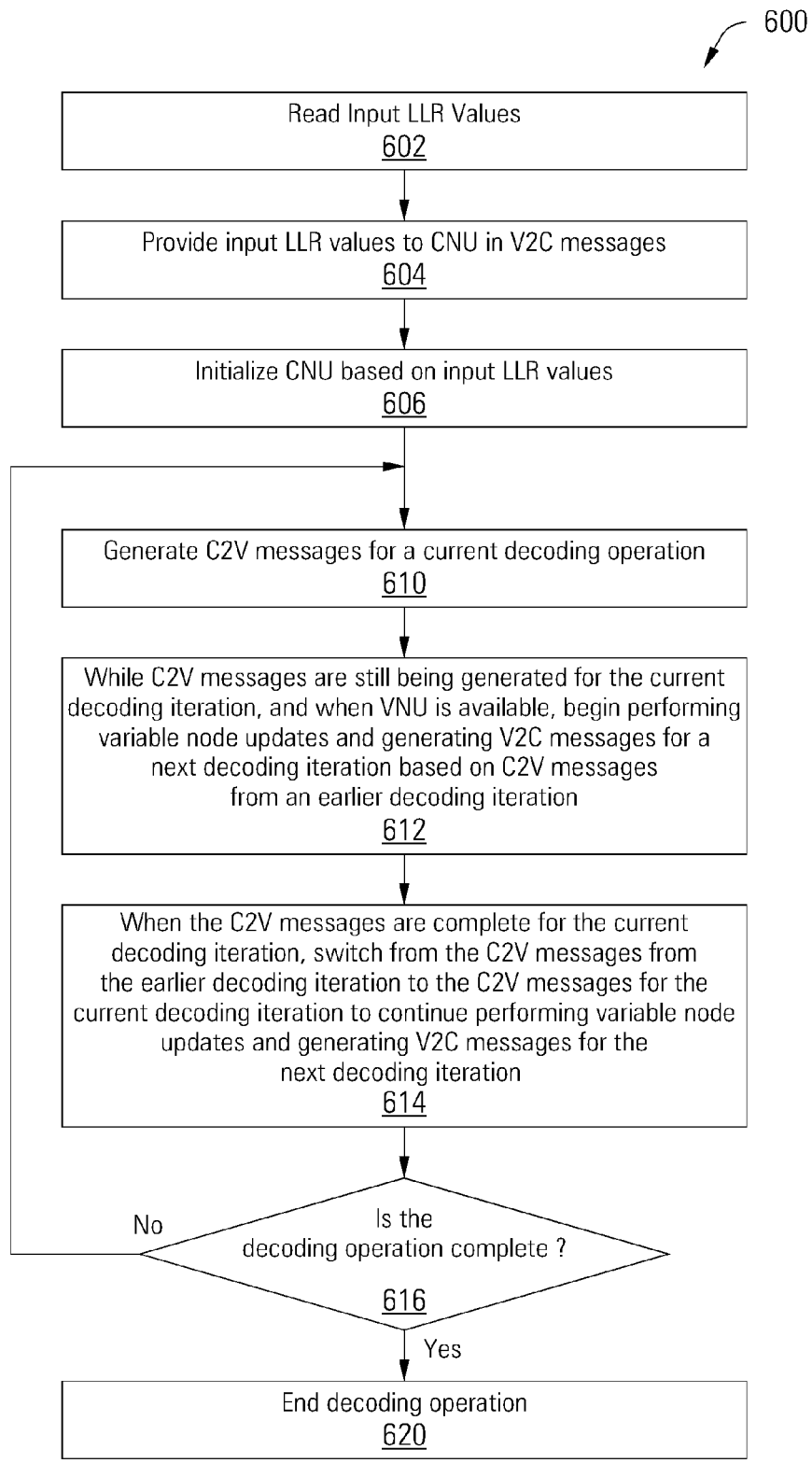
FIG. 6 depicts a flow diagram of an operation for non-binary non-layer LDPC decoding with low latency scheduling in accordance with various embodiments of the present invention.

Turning now to FIG. 6, a flow diagram 600 depicts a method for non-binary non-layer LDPC decoding with VNU update scheduling operable to reduce decoding latency in accordance with various embodiments of the present invention. The method of FIG. 6, or variations thereof, may be performed in data decoding circuits such as those illustrated in FIGS. 3-5. Following flow diagram 600, input LLR values are received by the LDPC decoder. (Block 602) The input LLR values are provided to the CNU in V2C messages (block 604), and the CNU is initialized based on the input LLR values. (Block 606) C2V messages are generated (including performing check node updates) in the CNU for the current decoding operation. (Block 610) Initially, these are based on input LLR values. Later, when C2V messages are available to the VNU and variable node updates have been performed in the VNU based on C2V messages, C2V messages are generated based on updated LLR values for symbols stored either in the VNU or in an associated memory. The early local decoding iterations may be performed as disclosed above with respect to FIG. 5, for example sending V2C messages based on input LLR values for the first two iterations and initializing the CNU based on input LLR values. However, the LDPC decoder with low latency scheduling is not limited to this example initialization process.

While C2V messages are still being generated for the current decoding iteration, and when the VNU is available, the VNU begins performing variable node updates and generating V2C messages for the next decoding iteration, based on C2V messages from an earlier decoding iteration. (Block 612) When the C2V messages are complete for the current decoding iteration, the VNU switches from the C2V messages from the earlier decoding iteration to the C2V messages for the current decoding iteration to continue performing variable node updates and generating V2C messages for the next decoding iteration. (Block 614) A determination is made as to whether the decoding operation is complete, for example if the data has converged or if the maximum number of local decoding iterations have been performed. (Block 616) If so, the decoding operation is ended. (Block 620) Otherwise, decoding continues in the LDPC decoder by generating C2V messages for the next decoding iteration. (Block 610)

Low Density Parity Check (LDPC) technology is applicable to transmission of information over virtually any channel or storage of information on virtually any media. Transmission applications include, but are not limited to, optical fiber, radio frequency channels, wired or wireless local area networks, digital subscriber line technologies, wireless cellular, Ethernet over any medium such as copper or optical fiber, cable channels such as cable television, and Earth-satellite communications. Storage applications include, but are not limited to, hard disk drives, compact disks, digital video disks, magnetic tapes and memory devices such as DRAM, NAND flash, NOR flash, other non-volatile memories and solid state drives.

Figure 7:
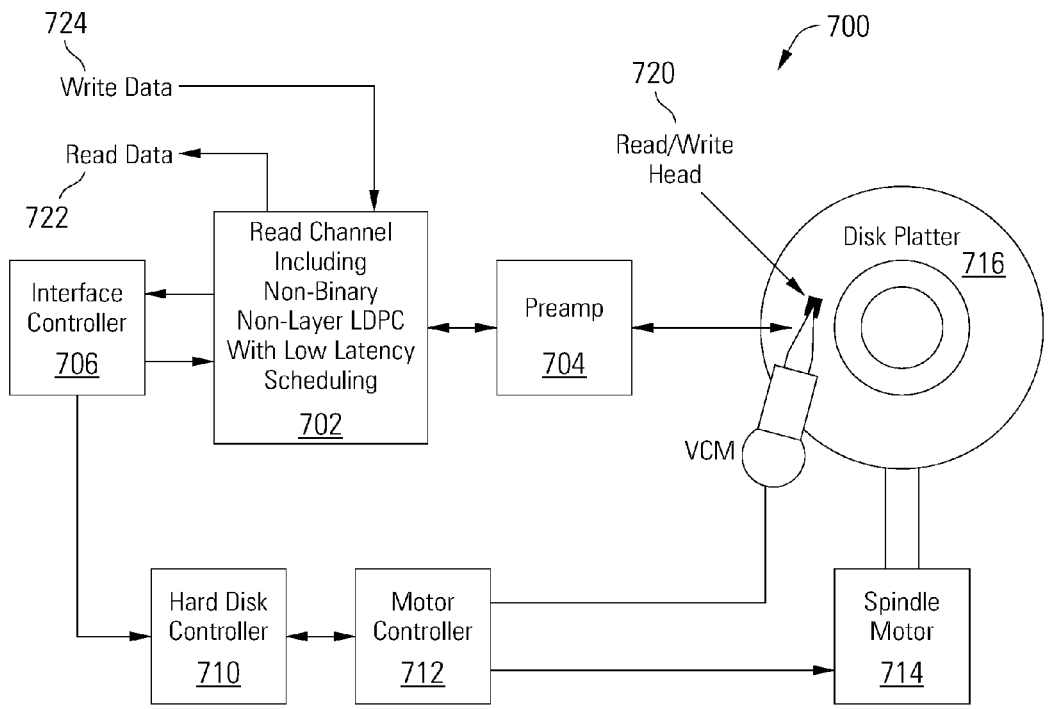
FIG. 7 depicts a storage system including a non-binary LDPC decoder with low latency scheduling in accordance with various embodiments of the present invention.
Figure 8:
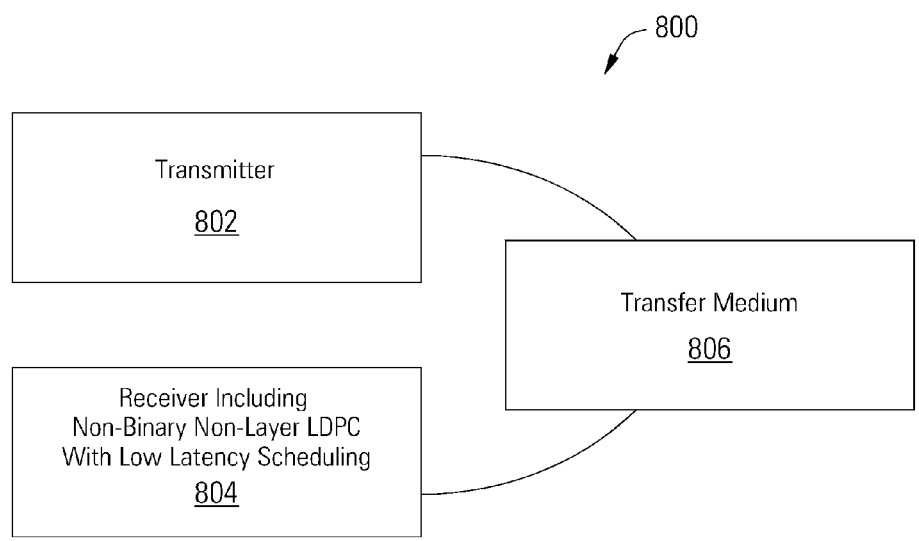
FIG. 8 depicts a wireless communication system including a non-binary LDPC decoder with low latency scheduling in accordance with various embodiments of the present invention.

Although the non-binary LDPC decoder with low latency scheduling disclosed herein is not limited to any particular application, several examples of applications are presented in FIGS. 7 and 8 that benefit from embodiments of the present invention. Turning to FIG. 7, a storage system 700 is illustrated as an example application of a non-binary LDPC decoder with low latency scheduling in accordance with some embodiments of the present invention. The storage system 700 includes a read channel circuit 702 with a non-binary LDPC decoder with low latency scheduling in accordance with some embodiments of the present invention. Storage system 700 may be, for example, a hard disk drive. Storage system 700 also includes a preamplifier 704, an interface controller 706, a hard disk controller 710, a motor controller 712, a spindle motor 714, a disk platter 716, and a read/write head assembly 720. Interface controller 706 controls addressing and timing of data to/from disk platter 716. The data on disk platter 716 consists of groups of magnetic signals that may be detected by read/write head assembly 720 when the assembly is properly positioned over disk platter 716. In one embodiment, disk platter 716 includes magnetic signals recorded in accordance with either a longitudinal or a perpendicular recording scheme.

In a typical read operation, read/write head assembly 720 is accurately positioned by motor controller 712 over a desired data track on disk platter 716. Motor controller 712 both positions read/write head assembly 720 in relation to disk platter 716 and drives spindle motor 714 by moving read/write head assembly 720 to the proper data track on disk platter 716 under the direction of hard disk controller 710. Spindle motor 714 spins disk platter 716 at a determined spin rate (RPMs). Once read/write head assembly 720 is positioned adjacent the proper data track, magnetic signals representing data on disk platter 716 are sensed by read/write head assembly 720 as disk platter 716 is rotated by spindle motor 714. The sensed magnetic signals are provided as a continuous, minute analog signal representative of the magnetic data on disk platter 716. This minute analog signal is transferred from read/write head assembly 720 to read channel circuit 702 via preamplifier 704. Preamplifier 704 is operable to amplify the minute analog signals accessed from disk platter 716. In turn, read channel circuit 702 decodes and digitizes the received analog signal to recreate the information originally written to disk platter 716. This data is provided as read data 722 to a receiving circuit. As part of decoding the received information, read channel circuit 702 processes the received signal using a non-binary LDPC decoder with low latency scheduling. Such a non-binary LDPC decoder with low latency scheduling may be implemented consistent with that disclosed above in relation to FIGS. 3-5. In some cases, the LDPC decoding may be performed consistent with the flow diagram disclosed above in relation to FIG. 6. A write operation is substantially the opposite of the preceding read operation with write data 724 being provided to read channel circuit 702. This data is then encoded and written to disk platter 716.

It should be noted that storage system 700 may be integrated into a larger storage system such as, for example, a RAID (redundant array of inexpensive disks or redundant array of independent disks) based storage system. Such a RAID storage system increases stability and reliability through redundancy, combining multiple disks as a logical unit. Data may be spread across a number of disks included in the RAID storage system according to a variety of algorithms and accessed by an operating system as if it were a single disk. For example, data may be mirrored to multiple disks in the RAID storage system, or may be sliced and distributed across multiple disks in a number of techniques. If a small number of disks in the RAID storage system fail or become unavailable, error correction techniques may be used to recreate the missing data based on the remaining portions of the data from the other disks in the RAID storage system. The disks in the RAID storage system may be, but are not limited to, individual storage systems such storage system 700, and may be located in close proximity to each other or distributed more widely for increased security. In a write operation, write data is provided to a controller, which stores the write data across the disks, for example by mirroring or by striping the write data. In a read operation, the controller retrieves the data from the disks. The controller then yields the resulting read data as if the RAID storage system were a single disk.

Turning to FIG. 8, a wireless communication system 800 or data transmission device including a receiver 804 with a non-binary LDPC decoder with low latency scheduling is shown in accordance with some embodiments of the present invention. Communication system 800 includes a transmitter 802 that is operable to transmit encoded information via a transfer medium 806 as is known in the art. The encoded data is received from transfer medium 806 by receiver 804. Receiver 804 incorporates a non-binary LDPC decoder with low latency scheduling. Such a non-binary LDPC decoder with low latency scheduling may be implemented consistent with that described above in relation to FIGS. 3-5. In some cases, the LDPC decoding may be done consistent with the flow diagrams discussed above in relation to FIG. 6.

It should be noted that the various blocks discussed in the above application may be implemented in integrated circuits along with other functionality. Such integrated circuits may include all of the functions of a given block, system or circuit, or a portion of the functions of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the present invention provides novel systems, devices, methods and arrangements for non-binary non-layer LDPC decoding with low latency scheduling of VNU updates. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. An apparatus for low density parity check data decoding comprising:
    a variable node processor operable to perform variable node updates based at least in part on check node to variable node message vectors;
    a check node processor operable to perform check node updates and to generate the check node to variable node message vectors; and
    a scheduler operable to cause the variable node processor to use check node to variable node message vectors from multiple decoding iterations when performing the variable node updates for a given decoding iteration, wherein the decoding comprises non-layer decoding.

2. The apparatus of claim 1, wherein the scheduler is operable to switch the variable node processor between the check node to variable node message vectors from the multiple decoding iterations when the check node processor completes the check node to variable node message vectors for one of the multiple decoding iterations.

3. The apparatus of claim 2, wherein the variable node processor is switched when the check node processor completes the check node to variable node message vectors for a last one of the multiple decoding iterations.

4. The apparatus of claim 1, wherein the variable node processor is operable to generate variable node to check node messages for a block of data in the given decoding iteration based in part on the check node to variable node message vectors from the multiple decoding iterations.

5. The apparatus of claim 1, wherein the given decoding iteration comprises a current decoding iteration, and wherein the multiple decoding iterations comprise a previous decoding iteration prior to the current decoding iteration and an earlier decoding iteration prior to the previous decoding iteration.

6. The apparatus of claim 1, wherein the scheduler is operable to cause the variable node processor to perform successive decoding iterations without idle cycles between the successive decoding iterations.

7. The apparatus of claim 1, wherein the scheduler is operable to cause the check node processor to perform successive decoding iterations without idle cycles between the successive decoding iterations.

8. The apparatus of claim 1, wherein the check node processor performs min-sum based low density parity checking.

9. The apparatus of claim 8, wherein the check node processor comprises finding lowest log likelihood ratio values, second lowest LLR values, and index of lowest LLR.

10. The apparatus of claim 1, wherein the apparatus is implemented as an integrated circuit.

11. The apparatus of claim 1, wherein the apparatus is incorporated in a storage device.

12. The apparatus of claim 11, wherein the storage device comprises:
    a storage medium maintaining a data set; and
    a read/write head assembly operable to sense the data set on the storage medium and to provide an analog output corresponding to the data set, wherein the variable node processor is operable to receive a signal derived from the analog output.

13. The apparatus of claim 11, wherein the storage device comprises a redundant array of independent disks.

14. The apparatus of claim 1, wherein the apparatus is incorporated in a transmission system.

15. A method for decoding non-binary low density parity check encoded data, the method comprising:
    generating check node to variable node messages for a current decoding iteration in a check node processor of a non-layer low density parity check decoder circuit; and
    performing variable node updates for a next decoding iteration in a variable node processor of the non-layer low density parity check decoder circuit based in part on check node to variable node messages for a previous decoding iteration while the check node processor is generating check node to variable node messages for the current decoding iteration, and further based in part on the check node to variable node messages for the current decoding iteration.

16. The method of claim 15, further comprising switching from the check node to variable node messages for a previous decoding iteration to the check node to variable node messages for the current decoding iteration when the check node processor completes the check node to variable node messages for the current decoding iteration.

17. The method of claim 15, further comprising generating the check node to variable node message based on a min-sum calculation.

18. The method of claim 17, wherein the min-sum calculation comprises finding lowest LLR values, second LLR values and indexes of lowest LLR values.

19. The method of claim 15, wherein no delays are inserted between decoding iterations in the check node processor or in the variable node processor.

20. A storage system comprising:
- a storage medium maintaining a data set;
- a read/write head assembly operable to sense the data set on the storage medium and to provide an analog output corresponding to the data set;
- an analog to digital converter operable to sample a continuous signal to yield a digital output; and
- a non-layer low density parity check decoder operable to decode the digital output comprising:
    - a variable node processor operable to perform variable node updates based at least in part on check node to variable node message vectors;
    - a check node processor operable to perform check node updates and to generate the check node to variable node message vectors; and
    - a scheduler operable to cause the variable node processor to use check node to variable node message vectors from multiple decoding iterations when performing the variable node updates for a given decoding iteration.

* * * * *